United States Patent
Heyer et al.

(10) Patent No.: US 6,291,799 B1
(45) Date of Patent: Sep. 18, 2001

(54) PROCESS AND ARRANGEMENT FOR HEAT TREATMENT OF TWO-DIMENSIONAL OBJECTS

(75) Inventors: Fritz Heyer, Wedel; Peter Roth, Hanau, both of (DE)

(73) Assignee: Angewandte Solarenergie - ASE GmbH, Alzenau (DE)

(*) Notice: Subject to any disclaimer, the term of this patent is extended or adjusted under 35 U.S.C. 154(b) by 0 days.

(21) Appl. No.: 09/493,123

(22) Filed: Jan. 28, 2000

(30) Foreign Application Priority Data

Feb. 1, 1999 (DE) .............................. 199 03 798

(51) Int. Cl.⁷ .................................... F27B 9/06
(52) U.S. Cl. ................ 219/388; 219/390; 219/405; 219/411; 118/724; 118/725; 118/50.1; 392/416; 392/418
(58) Field of Search ................... 219/390, 388, 219/405, 411; 118/724, 725, 728, 729, 50.1; 392/416, 418

(56) References Cited

U.S. PATENT DOCUMENTS 4,710,428 * 12/1987 Tamamizu et al. ............... 428/408
5,449,883   9/1995 Tsuruta .
6,008,476 * 12/1999 Neiconi et al. .................. 219/388

OTHER PUBLICATIONS

James E. Fair, "Rapid Thermal Processing for Active Matrix Devices"—Solid State Technology, Aug. 1992, pp. 47–52.

* cited by examiner

*Primary Examiner*—Teresa Walberg
*Assistant Examiner*—Shaurita Fuqua
(74) *Attorney, Agent, or Firm*—Dennison, Scheiner, Schultz & Wakeman

(57) ABSTRACT

The invention relates to a process for heat treatment of two-dimensional objects such as semiconductor wafers, for example in the form of silicon wafers, where the objects are arranged on supports and are conveyed through a heating unit, in particular continuously. To achieve a targeted treatment of a two-dimensional object, in particular of a semiconductor component such as a silicon wafer, on one side only, while at the same time achieving a high throughput with incorporation as necessary into a continuous overall manufacturing process, it is proposed that the objects be arranged in full surface contact with the supports, which cover the objects completely or almost completely on their underside and which in turn comprise quartz glass in particular.

21 Claims, 2 Drawing Sheets

PROCESS AND ARRANGEMENT FOR HEAT TREATMENT OF TWO-DIMENSIONAL OBJECTS

The invention relates to a process for heat treatment of two-dimensional objects such as semiconductor wafers, for example in the form of silicon wafers, where the objects are arranged on supports and are conveyed, in particular continuously, through a heating unit. The invention further relates to an array for heat treatment of two-dimensional objects, in particular semiconductor wafers such as silicon wafers and comprising the supports receiving the objects, a first conveyor device spanning a transport plane and conveying said objects through a heating unit, and supply and removal means for supplying and removing the objects to/from the supports.

The continuous heat treatment, in particular high temperature of semiconductor wafers, are necessary for processes such as oxidation of the semiconductor surface, sintering of layers onto the semiconductors, for example metal contacts or other antireflective coatings, or doping of the semiconductor material by diffusion.

In the application diffusion, oxidation and sintering of contacts and antireflective coatings, however, the prior art entails considerable problems in respect of the processes.

In the manufacture of semiconductor components, in particular of solar cells, thin and highly doped layers must be generated in one or more consecutive process steps on the surface of semiconductor wafers. These can either have the opposite conduction type to the base material, i.e., a highly n doped layer on p-doped base material or a highly p-doped layer on n-doped base material, or the highly doped layer can have the same conduction type as the base material.

The process used most frequently for this purpose is the diffusion of suitable dopants such as phosphorus or arsenic for n-conducting layers, or boron or aluminum for p-conducting layers.

The classic process for doping with phosphorus is diffusion in quartz tube furnace. In this process, the semiconductor wafers are placed in quartz hurdles so that the wafers are parallel and evenly spaced from one another. The hurdles are placed inside a process tube made of quartz and heated from the outside by radiation.

Inside the tube, the wafers are subjected to an oxidizing atmosphere containing phosphorus. Usually nitrogen is bubbled through a dopant in liquid form, e.g. phosphoryl chloride $POCl_3$ or phosphorus bromide $PBr_3$. It is then passed together with a further flow of nitrogen and oxygen into the heated process tube. More rarely, the highly toxic gas hydrogen phosphide $PH_2$ is passed into the process tube.

At temperatures between 800° C. and 1000° C., the following reactions take place in the process tube. The dopant decomposes and phosphorus pentoxide $P_2O_2$ and free Cl or Br is formed. The phosphorus pentoxide reacts with the silicon surface and forms silicon dioxide and phosphorus that is stored in the oxide.

From this silicon dioxide film, the phosphorus diffuses into the semiconductor in accordance with the concentration gradient. The properties of the n-doped layer, such as conductivity and penetration depth, depend on the concentration of phosphorus in the dopant film, on the temperature and duration of the heat treatment, and on the doping of the original material and its crystalline structure.

It is an advantage that the atmosphere in quartz tube furnaces can be kept very pure, since quartz glass can be made to a very high purity. In addition, the halogens released from the dopants contribute continuously to the cleaning of the furnace atmosphere, as they form with metals volatile halogenides that can be removed from the process tube together with the process gases.

However, there are severe drawbacks in particular for the manufacture of solar cells, since diffusion takes place on all sides, the throughput in the tube furnaces is relatively low, the process is not continuous but in individual batches, and the positioning of the wafers in quartz hurdles entails considerable expense, particularly when the upstream and downstream processes are continuous ones.

For making solar cells, therefore, a different process is being increasingly used. The semiconductor wafers are coated in a separate process step with a dopant film. This can be achieved by screen printing, spinning-on or spraying on of a film of phosphorus silicate polymers and organic solvents, or even diluted phosphoric acid.

The wafers thus coated then pass through a through-type furnace where first the organic constituents of the dopant film are evaporated or incinerated, a silicon oxide layer containing the phosphorus is generated, and finally the phosphorus is diffused from the remaining silicate film into the semiconductor material. The temperature profile of the furnace and the composition of the atmosphere in the furnace is carefully adapted to the processes here.

This process avoids the above drawbacks of the quartz tube furnace, but has another serious drawback: the furnace cannot be built completely metal-free. At least the necessary conveying device such as belt must be made of metal in view of the heavy stresses and the long operating duration required. Usually braided belts of high-temperature-proof Ni—Cr—Mo alloys are used.

It has been proven in extensive tests that impurities from the braided metal belt diffuse into the semiconductor wafers and shorten the life of the minority charge carriers or even cause short-circuits in the p n junction due to deposition, thereby diminishing the efficiency of the solar cells. This deterioration can also occur when direct contact of the semiconductor wafers with the transport belt is avoided. The degree of efficiency impairment correlates with the composition of the metal belt and with the composition of the semiconductor wafers and their crystalline structure.

For passivation of semiconductor surfaces or for making diffusion masks for photolithography, semiconductor wafers are subjected to an atmosphere containing oxygen or oxygen/steam at very high temperatures, in order to create an oxidation layer. If the process is performed in a through-type furnace, the same problems are described above occur.

Sintering of metallic coatings onto semiconductors is performed almost exclusively in through-type furnaces under a controlled atmosphere, as the specific temperature/time profiles needed for achieving a low contact resistance can only be achieved easily in through-type furnaces. During the sintering of contacts, temperatures of more than 800° C. are achieved for a short time. This can result—as is diffusion or oxidation in metals from the furnace atmosphere diffusing into the semiconductor and reducing the quality of the components produced.

A process for continuous heat treatment of semiconductor wafers is described in U.S. Pat. No. 5,449,883, where the wafers are supported on oscillating beams in a line and conveyed by these through a heat treatment zone and a cooling zone.

For thermal treatment of silicon films, they can be passed between light sources (US-Z; Fair, J., Rapid Thermal Processing for Active Matrix Devices, Solid State Technology, August 1992, p. 47–52).

The problem underlying the present invention is to develop a process and an arrangement of the type mentioned at the outset such that a targeted treatment of a two-dimensional object, in particular of a semiconductor component such as a silicon wafer, can take place on one side only, while at the same time a high throughput is achieved with incorporation as necessary into a continuous overall manufacturing process. Also, unproblematic loading of the supports with the objects should be possible. At the same time, it should be assured that there is no contamination of the objects by materials stemming from the supports, i.e. diffusing of such materials, even when high temperatures are applied The problem is solved by the process substantially in that the objects are arranged in full-surface or almost full-surface contact on the supports, which cover the objects completely or almost completely on their underside and which in turn comprise quartz glass in particular. Here the supports are aligned and arranged on a conveying device inside the thermal facility designed as a through-type furnace such that the supports have a closed or largely closed surface with a lateral extent in the transport plane provided by the conveying device and corresponding to the lateral extent of the through-type furnace.

With the teachings in accordance with the invention, whereby the objects are in full-surface or almost full-surface contact with quartz supports, the penetration of contaminants from the underside is ruled out. Since the supports is also subdivide the through-type furnace, i.e. the furnace chamber, into two almost completely separated part-chambers, the conveying device used can for example be a metallic conveying belt, without the risk of the metal diffusing into the objects. The area of the furnace chambers limited above the supports can be designed free of metals, so that there is no risk of contamination.

A particularly simple procedure sequence that at the same time assures a high throughput through the heating unit is achieved when the supports are conveyed in a closed circuit passing through the through-type furnace and comprising in turn a first conveyor device conveying the supports through the through-type furnace, a first transfer device transferring the supports to a second conveyor device after unloading of the objects conveyed thereon, and a second transfer device transferring the supports from the second conveyor device to the first conveyor device, where the latter can have a lower conveying speed than the second conveyor device.

To permit problem-free transfer of the objects onto the supports or their removal from the supports, it is furthermore provided that the supports are aligned at least in two axes, preferably longitudinally and transversely to the conveying direction of the first conveyor device, before arrangement of the objects on these supports and/or after their removal.

In accordance with a further noteworthy embodiment of the invention, it is provided that the supports are tilted during the transfer from the first to the second conveyor device, in order to remove any residues for example from objects that are damaged, without further cleaning being required.

An arrangement for heat treatment of two-dimensional objects, in particular semiconductor components such as silicon wafers, and comprising the supports receiving the objects, a first conveyor device spanning a transport plane and conveying the supports through a heating unit, and delivery and removal means for delivery/removal of the objects to/from the supports, is characterized in that the supports have a contact surface running parallel to the transport plane for full-surface or largely full-surface contact with the objects, where the supports themselves comprise quartz material. The supports are here disposed in the first conveyor device such that they form an almost closed surface in the transport plane, its lateral extent being adapted to that of the heating unit in the form of a through-type furnace.

The surface formed by the supports therefore separates the through-type furnace into an upper and a lower area, where the former should be free of metals.

It is furthermore provided that gas inlets or gas outlets are provided in each of the areas separated by the supports, said inlets or outlets being arranged preferably symmetrically to the conveying track and/or to the surface formed by the supports. This measure largely eliminates gas exchange between the areas, or part-chambers, so that the purity of the atmosphere in the upper and metal-free chamber is considerably improved.

All these measures permit the efficiency of solar cells to be increased by up to 0.8% absolute.

In a further embodiment of the invention, it is provided that the supports are arranged raised on the first conveyor device. To do so, the supports can have on their bottoms projections serving as supports. The supports themselves have a plate-like or tray-like design, where receptacles are provided on the upper side for the objects such that the latter can be positively gripped in order to arrange/remove the objects on/from the supports.

The conveyor device itself is a belt, such as a metal belt or plate conveyor, in order to withstand the high temperatures inside the heating unit that are necessary in particular in a sintering process.

It is furthermore provided that the array has several conveyor devices forming a circuit for the supports and comprising the first conveyor device conveying the supports through the heating unit such as a through-type furnace, a first transfer device transferring the supports to a second conveyor device after their passage through the heating unit and removal of the objects, and a second transfer device transferring the supports to the first conveyor device in the area of the heating unit. The second conveyor device has here in the area of the second transfer device a buffer area or a corresponding area is provided in front of it, to ensure that there are always supports available for being loaded with objects and conveyed through the heating unit, thus ensuring a high temperature.

The first and/or second transfer devices should have gripper elements for picking up the supports, said elements being movable along a transverse section such as a gantry for transferring the supports from the first to the second conveyor device and vice versa.

To ensure correct alignment of the supports and hence an automatic transfer of the objects to the supports or removal of the objects from the supports, it is furthermore provided that the supports in the area of the transfer device are alignable at least relative to two axes running parallel to the transport plane and extending in the conveying direction and transversely thereto.

The first transfer device furthermore comprises a tilting device permitting tilting of the support preferably by an angle of about 60°, thus ensuring that the remains of damaged objects, for example silicon wafers, can be removed from the support or tray.

Further details, advantages and features of the invention are shown not only in the claims and in the features they contain—singly and/or in combination—but also in the following description of a preferred embodiment shown in the drawing.

In the drawing,

FIG. 1 shows purely in principle an arrangement for high-temperature treatment in particular of two-dimensional objects in the form of semiconductor wafers 10, without this imposing any limit on the teachings in accordance with the invention; rather, the array described in the following and the process to be implemented therewith is generally suitable for heat treatment of two-dimensional objects.

Figure 1:
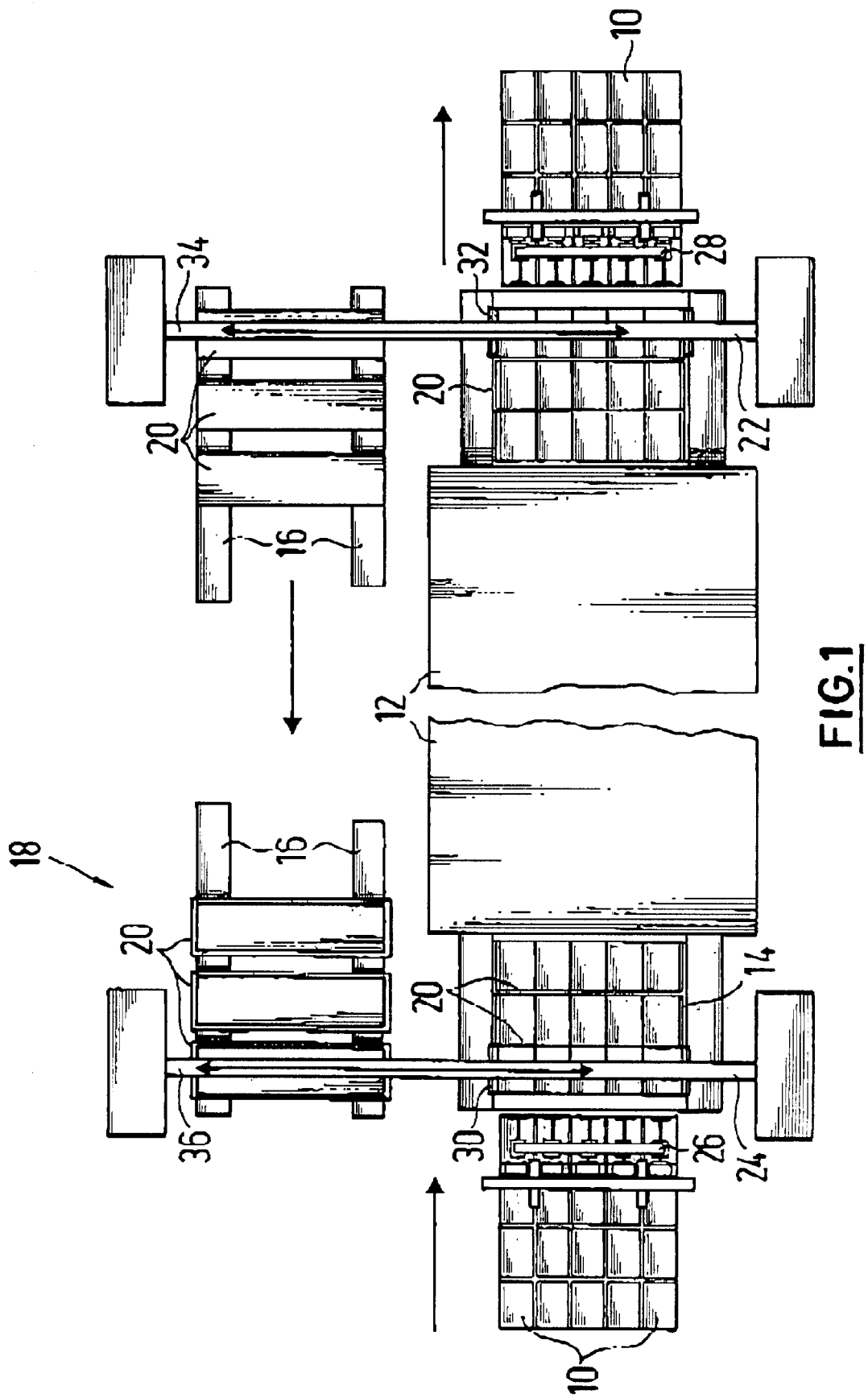
FIG. 1 shows a principle view of an arrangement for temperature treatment of two-dimensional objects.
Figure 2:
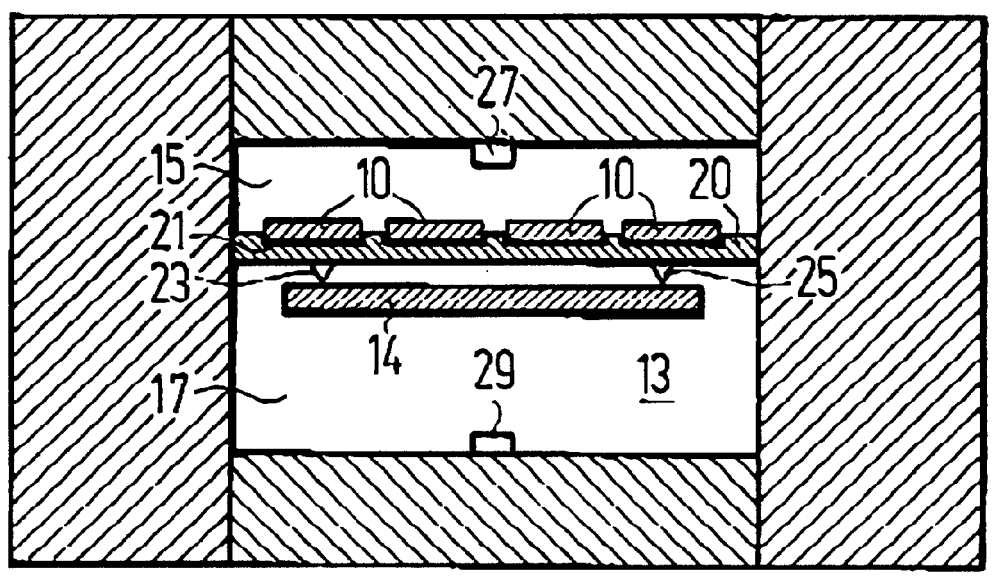
FIG. 2 shows a section through a through-type furnace.

The arrangement comprises a heating unit 12 designed as a through-type furnace in which the semiconductor wafers 10, which may be intended for the manufacture of solar cells, are subjected to processes such as diffusion, oxidation or sintering at the temperature necessary to do so.

The arrangement furthermore has a first conveyor device 14 designed as a conveying belt and passing through the through-type furnace 12 for treating semiconductor wafers or disks 10, and a second conveyor device 16 with a buffer area 18. The conveying tracks formed by the conveyor devices 14, 16 run in opposite directions, but parallel to one another, with the objects 10 or the supports 20 holding them being transferring from one conveyor device 14 to the other conveyor device 16 and vice versa by transfer devices 22, 24.

To deliver the objects 10 to the supports and to remove them from the supports, delivery and removal devices 26, 28 in the form of multiple grippers, for example, are provided that positively grip the objects 10, i.e. the semiconductor components in the design example, at their edges, thereby ruling out any damage to the surface in particular.

The supports 20 are made of quartz and can be referred to as quartz trays, with several objects being arranged preferably on one support 20 in a row transversely to the conveying direction of the belt 14. It is of course also possible to provide several supports adjacent to one another in a row transverse to the conveying direction. Regardless of the design of the supports 20, however, they are aligned and lined up with one another end and extend transversely to the conveying direction in such a way that an almost closed surface is obtained, whose lateral extent is adjusted to that of the through-type furnace 12, i.e. its furnace chamber 13, in such a way that the supports 20 separate the chamber 13 into an upper area 15 and a lower area 17. This largely rules out any gas exchange between the areas 15 and 17.

The objects 10 themselves are in full-surface contact with the supports 20, so that only their free upper sides are directly exposed to the through-type furnace 12 and hence to the gases present therein.

The supports 20 can have suitable nests 21 for clear positioning of the objects 10, the nests being designed differently in some areas relative to the geometry of the objects in such a way that the objects can be positively gripped and set down by the grippers 26, or removed from the nests by the grippers 28 after the supports 20 have passed through the through-type furnace 12.

To that end, the nests 21 or recesses have, in the area of the longitudinal edges of the objects 10 that run transverse to the conveying direction, extensions so that the gripper elements can grip the objects 10.

Instead of nests 21, webs or other positioning means can also be provided for positioning the objects clearly on the supports 20 to prevent any uncontrolled shifting during conveying.

Before the objects 10 are loaded into the supports 20, the latter are aligned both longitudinally to the conveying direction of the belt 14 and transversely thereto by adjusting means 30, preferably designed as grippers, in such a way that the objects 10 can be set down properly. Alignment also takes place after passage through the through-type furnace 12 in the area of the transfer device 22 using appropriate elements such as grippers.

To transfer the supports 20 from the conveying belt 14 to the second conveyor device 16 after removal of the objects, the transfer device 22 is provided, and has gripper elements, not shown, moving along a gantry 34. The transfer device 24 is designed correspondingly in order to transfer the supports 20 from the conveyor device 16 to the conveying belt 14 by means of a gripper movable along a gantry 36.

In order for the supports 20 or quartz trays to be lifted without problem off the conveying belt 14, they are mounted raised. To that end, spacer elements 23, 25 can extend from the undersides of the supports 20.

It is furthermore provided that the gripper transferring the supports 20 from the conveying belt 14 to the conveyor device 16 can be swiveled during movement along the gantry 34, so that the supports 20 are tilted about their longitudinal axis by an angle of, for example, 60°. This permits ejection, i.e. removal, of any fragments for example of damaged objects present on the support 20.

Since the supports 20 during passage through the furnace 12 have an almost closed surface with a lateral extent corresponding to that of the furnace 12, the latter is separated as already mentioned into an upper and a lower chamber, 17 and 15. The conveying belt 14 can therefore be made of metal, without the risk of metal being diffused into the objects 10, provided that the upper part-chamber 15 is metal-free.

It is furthermore provided that gas inlets and outlets 27, 29 such as gas extractors are provided, above and below the conveying belt 14 and preferably symmetrically to a symmetry plane spanning the conveying belt 14, thereby largely preventing gas exchange between the upper and lower part-chambers. As a result, the purity of the atmosphere in the upper part-chamber in which the objects 10 are heat-treated can be considerably improved. In the treatment of solar cells, an increase in efficiency of up to 0.8% absolute can be achieved by these measures.

What is claimed is:

1. A process for heat treatment of two-dimensional objects such as semiconductor wafers, for example in the form of silicon wafers, where the objects are arranged on supports and are conveyed, in particular continuously, through a heating unit, wherein the objects are arranged in full-surface or almost full-surface contact on the supports, with the supports covering the objects completely or almost completely on their underside and wherein the supports are aligned and arranged on a conveying device inside the thermal facility designed as a through-type furnace such that the supports have a closed or largely closed surface with a lateral extent in the transport plane provided by the conveying device and corresponding to the lateral extent of the through-hole furnace.

2. Process according to claim 1, wherein
   the supports are conveyed in a closed circuit passing through the through-type furnace and comprising in turn a first conveyor device conveying the supports through the through-type furnace, a first transfer device transferring the supports to a second conveyor device after unloading of the objects conveyed thereon, and a second transfer device transferring the supports from the second conveyor device to the first conveyor device.

3. Process according to claim 2, wherein the first conveyor device has a lower conveying speed than the second conveyor device.

4. Process according to claim 1, wherein the supports are aligned at least in the longitudinal and transverse directions to the conveying direction of the first conveyor device before arrangement of the objects on said supports and/or after their removal.

5. Process according to claim 1, wherein the objects are automatically placed on the supports or removed therefrom.

6. Process according to claim 2, wherein the supports are swiveled or tilted during the transfer from the first to the second conveyor device.

7. Arrangement for heat treatment of two-dimensional objects (10), in particular semiconductor wafers such as silicon wafers, and comprising the supports (20) receiving the objects, a first conveyor device (14) spanning a transport plane and conveying said objects through a heating unit (12), and supply and removal means (26, 28) for supplying and removing the objects to/from the supports, wherein the supports (20) have a contact surface running parallel to the transport plane for full-surface or largely full-surface contact with the objects (10) and wherein said supports are disposed on said first conveyor device (14) such that they form an almost closed surface in the transport plane, the lateral extent of the surface being adapted to that of said heating unit (12) in the form of a through-type furnace.

8. Arrangement according to claim 7, wherein the supports (20) comprise quartz material.

9. Arrangement according to claim 7, wherein the supports (10) separate the through-type furnace into an upper and a lower furnace part-chamber (15, 17).

10. Arrangement according to claim 9, wherein the upper furnace part-chamber (15) receiving the objects (10) is free of metals.

11. Arrangement according to claim 9, wherein gas inlets and/or outlets (27, 29) are provided in each of the part-chambers (15, 17) separated by the supports (20), said inlets or outlets being arranged preferably symmetrically to the conveying track and/or to the surface formed by the supports (20).

12. Arrangement according to claim 7, wherein the supports (20) are arranged raised on the first conveyor device (14).

13. Arrangement according to claim 7, wherein the supports (20) have a plate-like or tray-like design and receptacles (21) on the upper side for the objects (10) such that the latter can be positively gripped.

14. Arrangement according to claim 7, wherein the extent of the supports transverse to the transport direction is equal or approximately equal to the internal clear width of the heating unit (12) in this area.

15. Arrangement according to claim 7, wherein the arrangement has several conveyor devices forming a circuit for the supports (20) and comprising the first conveyor device (14) conveying the supports through the heating unit (12) such as a through-type furnace, a first transfer device (22) transferring the supports to a second conveyor device (16) after their passage through the heating unit and removal of the objects, and a second transfer device (24) transferring the supports to the first conveyor device in the area of the heating unit.

16. Arrangement according to claim 15, wherein the second conveyor device (16) has in the area of the second transfer device (24) a buffer area, or a corresponding area is assigned thereto.

17. Arrangement according to claim 15, wherein the first and second transfer device (22, 24) have gripper elements for picking up the supports (20).

18. Arrangement according to claim 17, wherein the gripper elements are movable along a transverse section such as a gantry (34, 36) for transferring the supports from the first (14) to the second conveyor device (16) and vice versa.

19. Arrangement according to claim 15, wherein the supports (20) are alignable in the area of the transfer device (22, 24) at least relative to two axes running parallel to the transport plane.

20. Arrangement according to claim 15, wherein the first transfer device (22) has a tilting device permitting tilting of the support (20) by an angle in the range from 45° to 70°.

21. Arrangement according to claim 7, wherein the first conveyor device (14) has gripper elements (24, 26) for positively gripping of the objects (10) in order to deliver/remove the objects to/from the supports (20), or gripper elements (24, 26) are provided in front of or behind said supports.

\* \* \* \* \*